(12) United States Patent
Shih et al.

(10) Patent No.: US 6,375,737 B2
(45) Date of Patent: Apr. 23, 2002

(54) METHOD OF SELF-ASSEMBLY SILICON QUANTUM DOTS

(75) Inventors: An Shih, Changhua Hsien; Chao-Yu Meng, Taichung; Si-Chen Lee, Taipei, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/827,582

(22) Filed: Apr. 5, 2001

(30) Foreign Application Priority Data

May 18, 2000 (TW) ........................................ 89109546 A

(51) Int. Cl.[7] .............................................. C30B 25/02
(52) U.S. Cl. ..................... 117/3; 65/63; 117/11; 265/15
(58) Field of Search ........................... 117/3, 11; 65/63; 265/15

(56) References Cited

U.S. PATENT DOCUMENTS 5,608,231 A * 3/1997 Ugajin et al. ................. 257/24

* cited by examiner

*Primary Examiner*—Felisa H. Teshew
(74) *Attorney, Agent, or Firm*—Christensen O'Connor Johnson Kindness PLLC

(57) ABSTRACT

A method of self-assembling silicon quantum dots comprises the steps of providing a substrate, forming a thin amorphous Si film, and forming a plurality of Si quantum dots by controlling the energy and the shooting numbers of an excimer laser during an annealing process, wherein the excimer laser emits light on the thin amorphous Si film.

10 Claims, 5 Drawing Sheets

METHOD OF SELF-ASSEMBLY SILICON QUANTUM DOTS

BACKGROUND OF THE INVENTION

1. Field of the Invention

The present invention relates to a method of self-assembling silicon quantum dots, and especially relates to the self-assembling silicon quantum dots on an amorphous silicon film by an excimer laser.

2. Description of Prior Art

In recent years, semiconductor quantum dots have been extensively applied in the field of photonics devices, such as photo-detectors, light emitting diodes (LEDs), semiconductor laser diodes (LDs), single electron devices, and others. A large number of experimental and theoretical studies have investigated semiconductor quantum dots.

Quantum dots are usually formed by using quantum well structure. U.S. Pat. No. 5,229,320 disclosed "Method For Forming Quantum Dots". With reference to FIG. 1A to FIG. 1D, a film of quantum well formed on a substrate and then a layer 10 of photoresist formed thereon. Finally, the quantum dots 32 formed on a film of quantum well by the electron-beam lithography. However, the methods cause a lot of surface states, and the surface states became the main source of non-radiative recombination center. Further, the surface state reduced the optical property of quantum dots. For example, the intensity of luminance resulting from conventional quantum dots is lower than that resulting from quantum well. The optical linewidth caused by the conventional quantum dots is wider than that caused by the quantum well. In addition, the method of electron-beam lithography is slow and has difficulty manufacturing a large-area device.

Quantum dots can also be formed in the Stranski-Krastanov mode (SK mode) by MBE or MOCVD. However, the quantum dots formed by MBE or MOCVD are restricted to the material of InAs/GaAs or SiGe/Si, and confined to the substrate.

SUMMARY OF THE INVENTION

In accordance with the present invention, the object is attained by a method of self-assembling quantum dots. A thin Si film forms on a substrate and then the thin Si film (<100 nm) is formed into poly-Si quantum dots by utilizing an excimer laser to proceed with the annealing process.

The present invention has an advantage in that the quantum dots of Si are simply and quickly formed by the self-assembling method. Further, utilizing a laser scanner on a large-area film of Si can form a large-area device of Si quantum dots.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

As shown in FIG. 2A to FIG. 2D, the method of self-assembling quantum dots of the preferred embodiment of the present invention comprises the steps listed below.

Figure 1A:
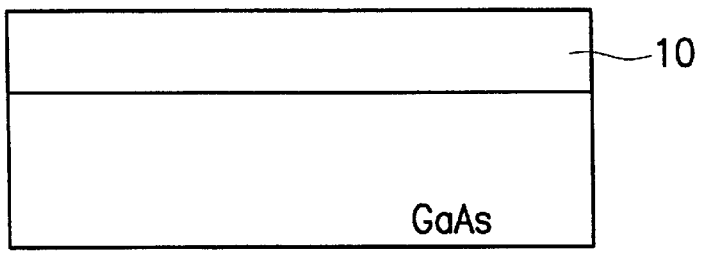
FIG. 1A to FIG. 1D is a cross-sectional view of the conventional method of fabricating quantum dots.
Figure 1B:
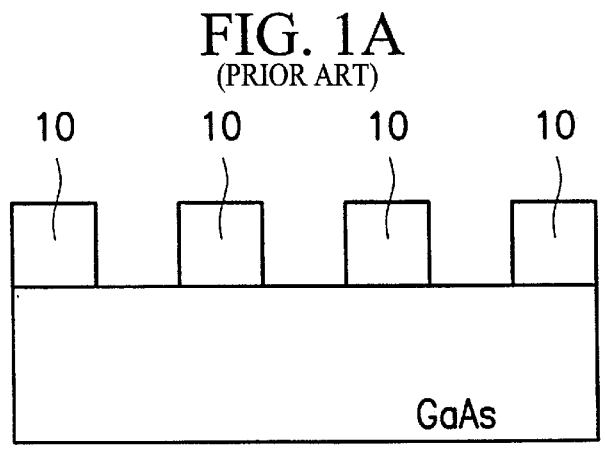
Figure 1C:
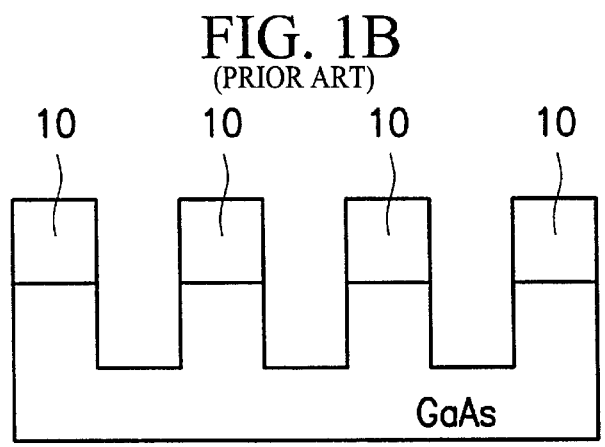
Figure 1D:
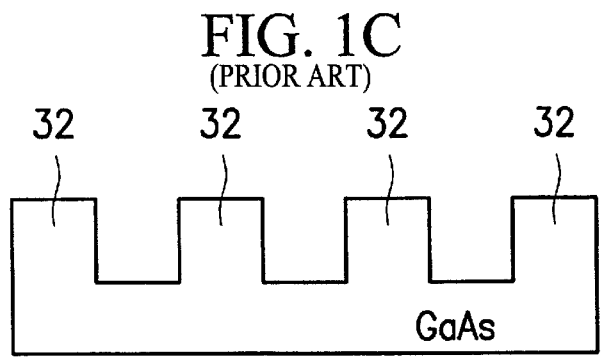
Figure 2A:
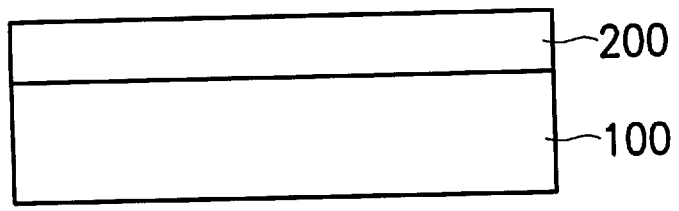
FIG. 2A to FIG. 2D is a cross-sectional view of the embodiment of present invention.

(1) With reference to FIG. 2A, a thin film made of amorphous-Si is formed on a substrate.

A corning 7059 glass substrate 100 is positioned in the PECVD and the substrate heated to 250° C. The pressure in the reaction chamber of the PECVD is kept at 0.45 torr, and $SiH_4$ and $H_2$ flow in the reaction chamber, these deposit a thin layer (<100 nm)—a hydrogenated amorphous silicon (refer to a-Si:H) film 200. The flow rate of $SiH_4$ is 5 sccm, and the flow rate of $H_2$ is 2 sccm. The growth rate of the a-Si:H film 200 is 0.27 nm/sec, and the concentration of $H_2$ in the a-Si:H film 200 is measured by secondary ion mass spectrometry (refer to SIMS) is $3.9 \times 10^{21}$ cm$^{-3}$.

Figure 2B:
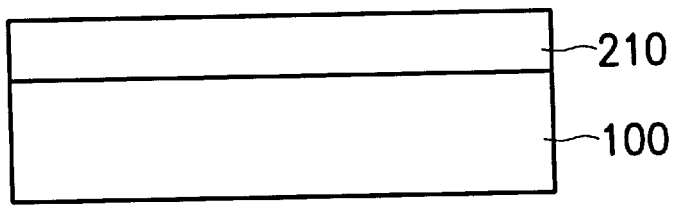

(2) With reference to FIG. 2B, after depositing a layer of quantum well, the H atoms are removed from the film by the annealing process.

The a-Si:H film 200 positioned in a reaction chamber filled with $N_2$ is heated to 550° C. during the annealing process for two hours. All the H atoms in the a-Si:H film 200 are expelled, and an amorphous Si film 210 is formed.

Figure 2C:
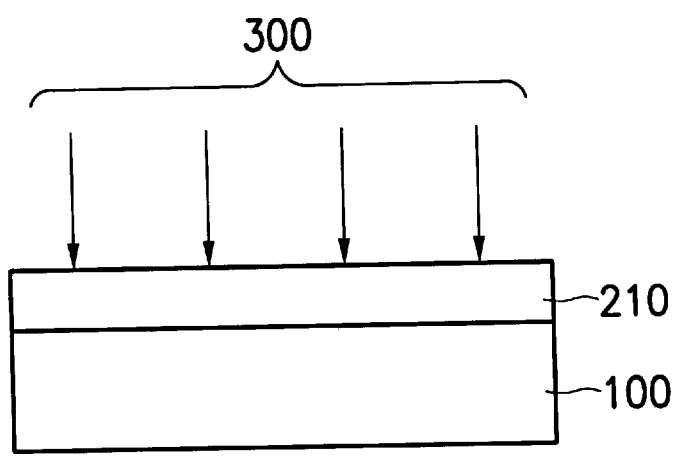

(3) With reference to FIG. 2C, the Si quantum dots are in the form of self-assembling by utilizing an excimer laser.

The amorphous Si film 210 is positioned in a reaction chamber, wherein the temperature is kept at room temperature and the pressure is less than $8 \times 10^{-6}$ torr. A pulsed laser 300 emitted from a pulsed KrF excimer laser is incident on the amorphous Si film 210 at room temperature (Under the conditions of $\lambda = 248$ nm, pulse duration=28 ns, and frequency=1 Hz). The laser emitted from the excimer laser 300 is incident on the surface of an amorphous Si film 210 to proceed with the laser annealing process, and then the poly-Si quantum dots are produced by self-assembling.

Figure 2D:
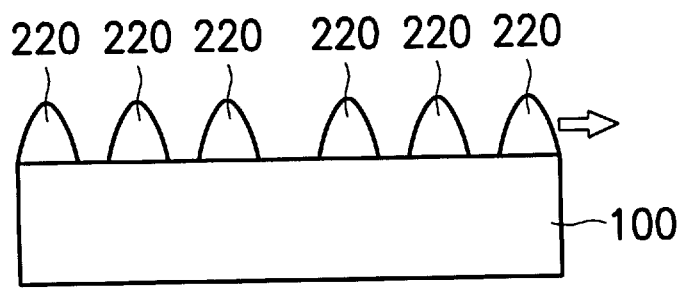

(4) FIG. 2D shows the cross-sectional view of the Si quantum dots formed by the laser annealing process. As shown in FIG. 2D, after proceeding with the laser annealing process, the amorphous Si film forms the poly-Si quantum dots 220 by self-assembling.

Figure 3:
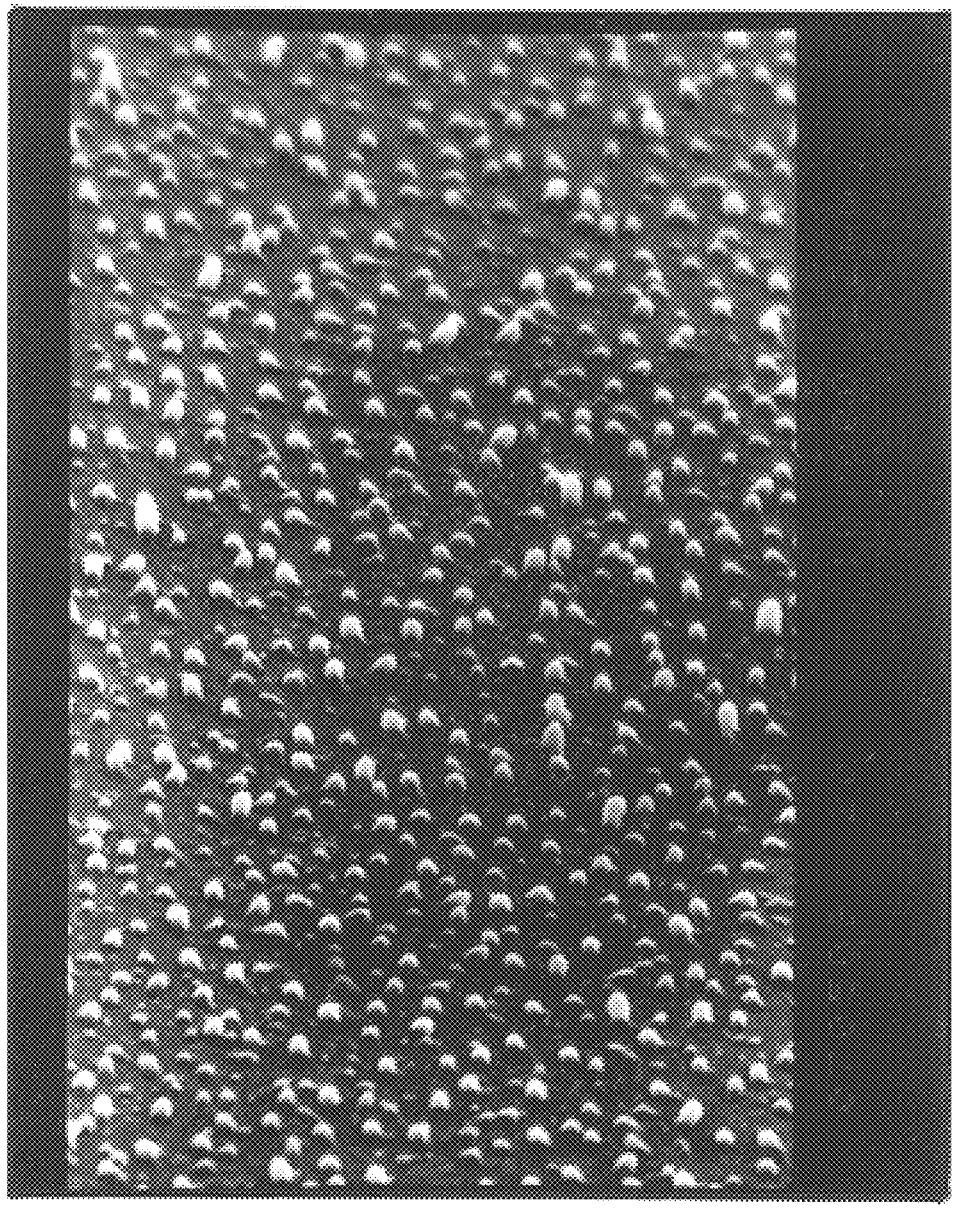
FIG. 3 shows a SEM picture of the poly-Si pillars after annealing process utilizing excimer laser.

FIG. 3 shows a SEM picture of an amorphous Si film of thickness 50 nm forming on a glass substrate after the annealing process utilizing an excimer laser. The operational conditions of the excimer laser are that the laser energy is 125 mJ/cm$^2$ and the shooting numbers are 50. As shown in FIG. 3, the amorphous Si film forms a plurality of pillars by the annealing process utilizing the excimer laser but doesn't form quantum dots. The diameter of the pillar is about 230 nm, and the height is about 25 nm.

Figure 4:
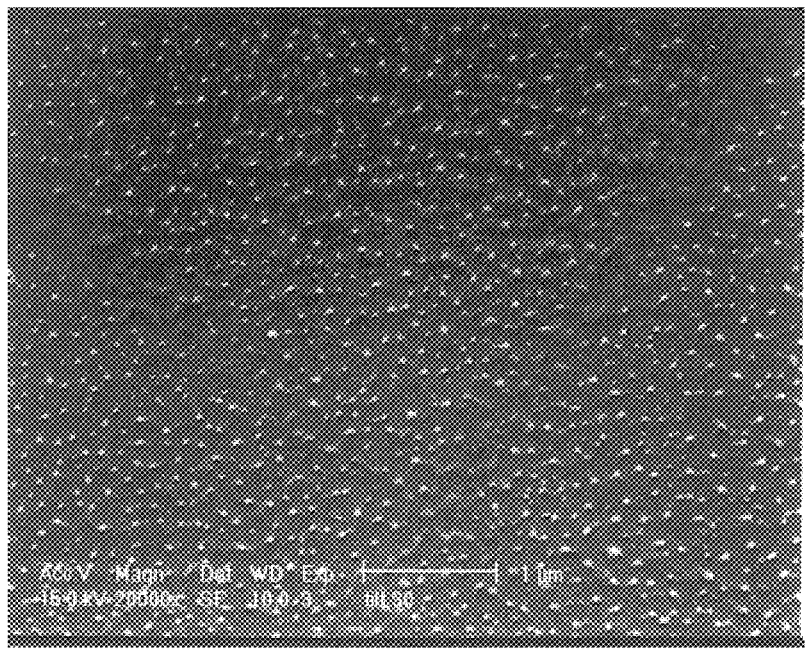
FIG. 4 shows a SEM picture of the poly-Si quantum dots after annealing process utilizing excimer laser.

FIG. 4 shows a SEM picture of an amorphous Si film of thickness 50 nm forming on a glass substrate after the annealing process utilizing an excimer laser. The operational conditions of the excimer laser are that the laser energy is 225 mJ/cm$^2$ and the shooting number is 1. As shown in FIG. 4, the amorphous Si film forms a plurality of pillars by annealing process utilizing the excimer laser. An atomic force microscope can measure the dimensions of the pillars. The diameter of the protrusion is about 230 nm, and the height is about 25 nm. Because the dimensions of the pillars are too large, the amorphous Si film hasn't formed the poly-Si quantum dots.

Figure 5:
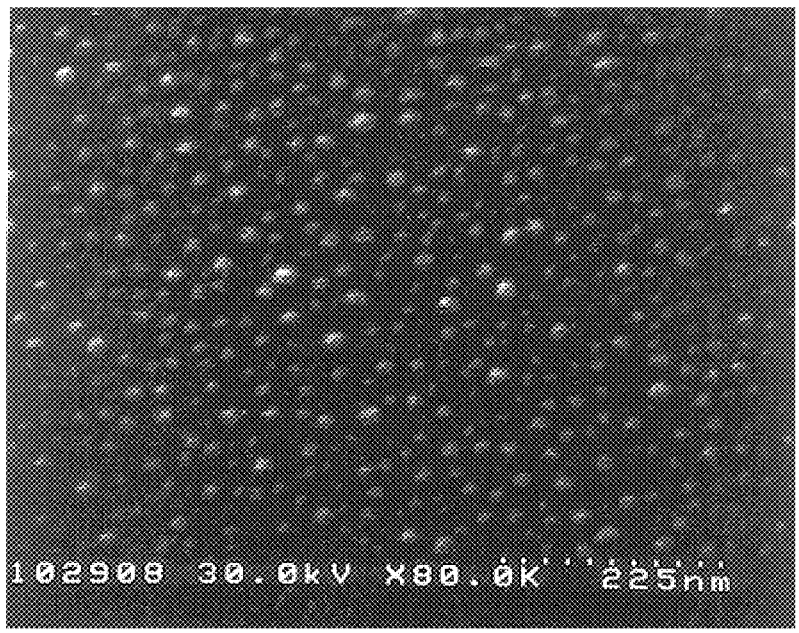
FIG. 5 shows a SEM picture of the poly-Si quantum dots formed by self-assembling during annealing process.
Figure 6:
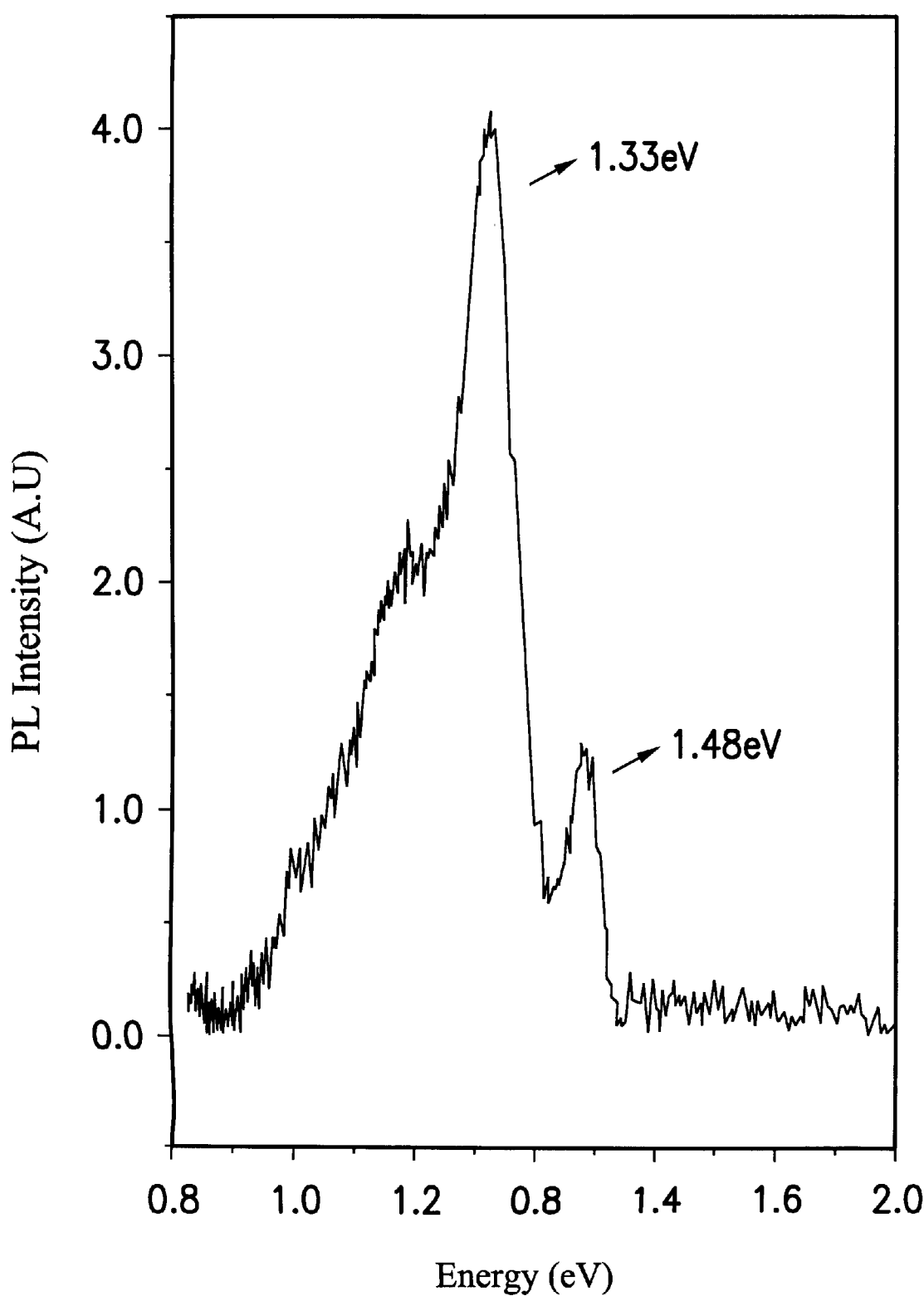
FIG. 6 is a photoluminescence spectrum emitted from self-assembled quantum dots at low temperature.

FIG. 5 shows a SEM picture, wherein an amorphous Si film of thickness 1.5 nm forms on a glass substrate formed the self-assembly quantum dots after annealing process utilizing an excimer laser. The operational conditions of the excimer laser are that the laser energy is 250 mJ/cm$^2$ and the shooting number is 1. As shown in FIG. 5, the amorphous Si film forms the self-assembling Si quantum dots by annealing process utilizing the excimer laser. The diameter of the quantum dot is about 14.2 nm, and the height is about 3.7 nm. FIG. 6 is a photoluminescence spectrum (refer to PL spectrum) emitted from self-assembled quantum dots at low temperature. As shown in FIG. 6, several peaks higher than the energy state of Si appear in the spectrum. Quantum dots of zero dimension exist as part of the phenomenon of quantum energy state.

The inferences of the preferred embodiment of the present invention concluded from FIG. 3 and FIG. 4 are that (A) the pillars will become larger with increased laser energy; (B) the pillars will become larger with increased shooting numbers. The inference of the preferred embodiment of the present invention concluded from FIG. 4 and FIG. 5 is that (C) the pillars change into quantum dots as decreasing the thickness of the amorphous Si film.

In the present invention, the quantum dots annealed from amorphous Si film with a thickness of 1~50 nm are formed in the following conditions:

the laser energy being 100~500 mJ/cm$^2$; and the shooting number of pulsed laser being 1~200.

In the present invention, the quantum dots annealed from amorphous Si film with thickness under 1.5 nm are formed in the following conditions:

the laser energy being 220~300 mJ/cm$^2$; and the shooting number of pulsed laser being 1~10.

In the embodiment of the present invention, a large-area structure of self-assembling Si quantum dots is annealed from the amorphous Si film by utilizing an excimer laser and a scanner.

In the present invention, it can use an insulating layer, such as $Si_3N_4$, $SiO_2$, or semiconductor substrate, such as Si, GaAs, etc., instead of using the glass substrate.

In the present invention, it can also use a low pressure chemical vapor deposition (LPCVD) instead of the plasma enhanced CVD (PECVD) to directly form an amorphous Si film on a substrate at about 550° C.

In the present invention, the H atoms are removed from the a-Si:H film during the annealing process, and the temperature is set to a range from 500° C. to 600° C.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of self-assembling silicon quantum dots comprising the steps of:

providing a substrate and forming a thin amorphous Si film; and forming a plurality of Si quantum dots by controlling the energy and the shooting numbers of an excimer laser during annealing process, wherein the excimer laser emits light on the thin amorphous Si film.

2. A method of self-assembling silicon quantum dots according to claim 1, wherein the substrate comprises one selective of glass substrate, insulating layer on semiconductor substrate.

3. A method of self-assembling silicon quantum dots according to claim 1, further including a step of forming an amorphous Si film on the substrate by utilizing a CVD.

4. A method of self-assembling silicon quantum dots according to claim 3, wherein the CVD comprises one selective of PECVD and LPCVD.

5. A method of self-assembling silicon quantum dots according to claim 4, further including a step of forming a hydrogenated amorphous Si film by utilizing PECVD and then removing the H atoms in the hydrogenated amorphous Si film to form the amorphous Si film by annealing process.

6. A method of self-assembling silicon quantum dots according to claim 4, further including a step of forming the amorphous Si film directly by utilizing LPCVD.

7. A method of self-assembling silicon quantum dots according to claim 1, further including a step of forming a large-area amorphous Si film into a large-area Si quantum dots by utilizing a scanner during annealing process.

8. A method of self-assembling silicon quantum dots according to claim 1, wherein the thickness of amorphous Si film is less than 50 nm.

9. A method of self-assembling silicon quantum dots according to claim 8, as the thickness of amorphous Si film is between 1 nm and 50 nm, the laser energy is set to a range from 100 mJ/cm$^2$ to 500 mJ/cm$^2$ and the shooting number is set to a range from 1 to 200.

10. A method of self-assembling silicon quantum dots according to claim 8, as the thickness of amorphous Si film is less than 1.5 nm, the laser energy is set to a range from 220 mJ/cm$^2$ to 300 mJ/cm$^2$ and the shooting number is set to a range from 1 to 10.

* * * * *